US005896649A

United States Patent [19]

Millhimes et al.

[11] Patent Number: 5,896,649

[45] Date of Patent: Apr. 27, 1999

[54] SEATING TOOL FOR INSTALLING ELECTRICAL CONNECTORS TO PRINTED CIRCUIT BOARDS

[75] Inventors: Wayne Leroy Millhimes, Hershey; Todd Alan Shuey, Camp Hill, both of Pa.; Anton Paul Ness, Wilmington, Del.; Katherine Alice O'Neil Nelson, Enola, Pa.; Harold Elwood Friedline, Newark, Del.

[73] Assignee: The Whitaker Corporation, Wilmington, Del.

[21] Appl. No.: 08/827,084

[22] Filed: Mar. 26, 1997

[51] Int. Cl.[6] .................... H05K 3/32

[52] U.S. Cl. .................... 29/739; 29/741; 29/759; 29/760; 269/303; 269/903

[58] Field of Search .................... 29/739, 741, 759, 29/760, 837, 842, 845; 269/289 R, 313, 74, 16, 53, 903, 47, 50, 51, 99, 303, 305, 309, 315

[56] References Cited

U.S. PATENT DOCUMENTS

| | | | |
|---|---|---|---|
| 3,807,045 | 4/1974 | Bennett et al. | 29/845 |
| 4,357,062 | 11/1982 | Everett | 29/845 X |
| 4,372,044 | 2/1983 | Chisholm | 29/845 |
| 4,383,361 | 5/1983 | Kautz | 29/845 X |
| 4,391,482 | 7/1983 | Czeschka | 29/845 X |
| 4,467,523 | 8/1984 | Chisholm | 29/845 |
| 4,503,610 | 3/1985 | Resch | 29/845 |
| 4,533,129 | 8/1985 | Malmquist et al. | 269/903 |
| 4,543,713 | 10/1985 | Rapp | 29/837 |
| 4,550,962 | 11/1985 | Czeschka | 439/78 |
| 4,664,366 | 5/1987 | Lane et al. | 269/303 |
| 4,718,165 | 1/1988 | Reuss | 29/842 |
| 4,719,695 | 1/1988 | Sturner | 29/760 |
| 4,871,321 | 10/1989 | Johnson | 439/79 |
| 4,948,105 | 8/1990 | Yonezawa | 269/309 X |
| 4,955,819 | 9/1990 | Harting et al. | 439/79 |
| 5,026,033 | 6/1991 | Roxy | 269/309 X |
| 5,193,793 | 3/1993 | Pollock | 269/309 X |
| 5,355,573 | 10/1994 | Hayashi et al. | 269/47 X |
| 5,453,016 | 9/1995 | Clark et al. | 439/79 |
| 5,600,881 | 2/1997 | Wanha | 29/741 |
| 5,735,039 | 4/1998 | Shuey et al. | 29/845 X |

FOREIGN PATENT DOCUMENTS

| | | | |
|---|---|---|---|
| 48806 | 6/1988 | Japan | 29/739 |

*Primary Examiner*—Peter Vo
*Assistant Examiner*—Rick Kiltae Chang
*Attorney, Agent, or Firm*—Katherine A. Nelson; Anton P. Ness

[57] ABSTRACT

A seating tool 10 for installing connectors on a circuit board comprises a base plate 12, an alignment plate 40 and fasteners 60 to fasten them together at respective fastening locations. The alignment plate 40 has at least two connector alignment surfaces 42, 44 at different locations thereon and a set of at least two fastening locations 46, 48 associated with a respective alignment surface for securing the alignment plate 40 to the base plate 12 in at least two orientations relative to the base plate 12 to accommodate board-mounting of differing connectors having different dimensions of the posts from the front faces of the connectors.

4 Claims, 8 Drawing Sheets

SEATING TOOL FOR INSTALLING ELECTRICAL CONNECTORS TO PRINTED CIRCUIT BOARDS

FIELD OF THE INVENTION

The present invention relates generally to electrical connectors and more particularly to seating tools used to mount electrical connectors to a substrate.

BACKGROUND OF THE INVENTION

When mounting electrical connectors to a substrate such as a printed circuit board "PCB", it is important that the board engaging posts of electrical terminals are precisely aligned with the corresponding through holes of the substrate. In some applications it is desirable to use terminals having compliant sections that are able to both mechanically secure the connector to the substrate and electrically connect the terminals therein to plated through-holes of the substrate without the need for solder. Mounting a vertically oriented electrical connector is relatively straight forward as tools can be used to apply pressure directly against the mating face of the connector or in some instances specialized tools are used to apply force directly to each of the terminals. Additional problems arise when mounting right angle connectors to a substrate, such as a circuit board, because the board mounting posts are offset from the mating face of the connector such that the insertion force must be exerted on the horizontally extending terminal portions above the compliant posts in a manner to ensure that compliant posts remain perpendicular to the through-holes as they are inserted into the board. Care needs to be taken not to apply pressure at the portion of the housing that extends laterally beyond the axes of the compliant posts causing the connector to tip and the compliant post to either bend or engage the through-holes at an acute angle. It is important, therefore, that the forward portion of the connector housing remain parallel to the mounting substrate during the assembly process.

SUMMARY OF THE INVENTION

For purposes of illustrating the invention, the tool is being shown being used to mount to a substrate, a connector of the type shown in U.S. patent application Ser. No. 08/610,099, filed Feb. 29, 1996 now U.S. Pat. No. 5,702,257, although it is to be understood that the tool can be used with numerous other connectors. The connector includes a plurality of terminals disposed in rows parallel to the connector front face. The terminals have board engaging posts for a connection to circuits of the board. The front face of the connector is at a preselected distance from the nearest row of terminals.

The tool includes a base plate, an alignment plate, and fasteners to secure together the base plate and alignment plate for facilitating mounting of the connector to the board. The base plate has opposed major surfaces and a plurality of rows of post-receiving openings extending at least partially therethrough from the first surface toward the second surface. The openings are associated with corresponding through holes of a circuit board to which the connector is to be mounted. The plate further includes at least two fastening locations proximate the rows of openings and located along an edge of the plate. The alignment plate has at least two connector alignment surfaces at different locations thereon and at least two sets of abutment surfaces, each associated with a respective connector alignment surface. The alignment plate further has a set of at least two fastening locations associated with each set of alignment surfaces to secure the alignment plate to the base plate. The alignment plate is removably securable to the edge of the base plate with a selected set of fastener locations aligned with the fastening locations of the base plate and the associated abutment surfaces pressed against those of the base plate edge. The plate is securable in one of at least two orientations relative to the base plate so that a selected one of the connector alignment surfaces extends orthogonally to the base plate and is precisely positioned at a corresponding one of at least two selected distances from a first row of openings. The distance is associated with the dimension of the connector from the front face thereof to the nearest terminal row, such that, upon positioning a circuit board on the base plate with the post-receiving openings aligned with the circuit board through-holes and positioning a connector above the circuit board with the front of the connector proximate the alignment surface, the posts are aligned with the through holes. When pressure is applied to the top of the housing to mount the connector to the board, the alignment plate maintains an upright orientation of the connector thereby preventing tipping. The alignment plate is securable to the base plate in at least two orientations to accommodate board mounting of different connectors having different dimensions of the row of posts from the front faces thereof corresponding to the selected distances.

In one embodiment the base plate openings are a series of slots that extend partially through the top surface thus enabling the same base plate to be used with connectors having terminals at different center line spacings. Additionally the base plate further includes one slot that extends through the plate to the lower surface thereof for positioning one or more alignment pins for holding the connector and circuit board in alignment with one another as the connector is mounted to the board.

DETAILED DESCRIPTION OF THE DRAWINGS

Figure 1A:
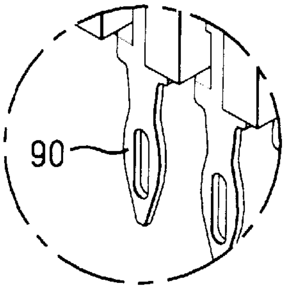
FIG. 1A is an enlarged fragmentary portion of FIG. 1 illustrating the compliant terminal post.
Figure 1:
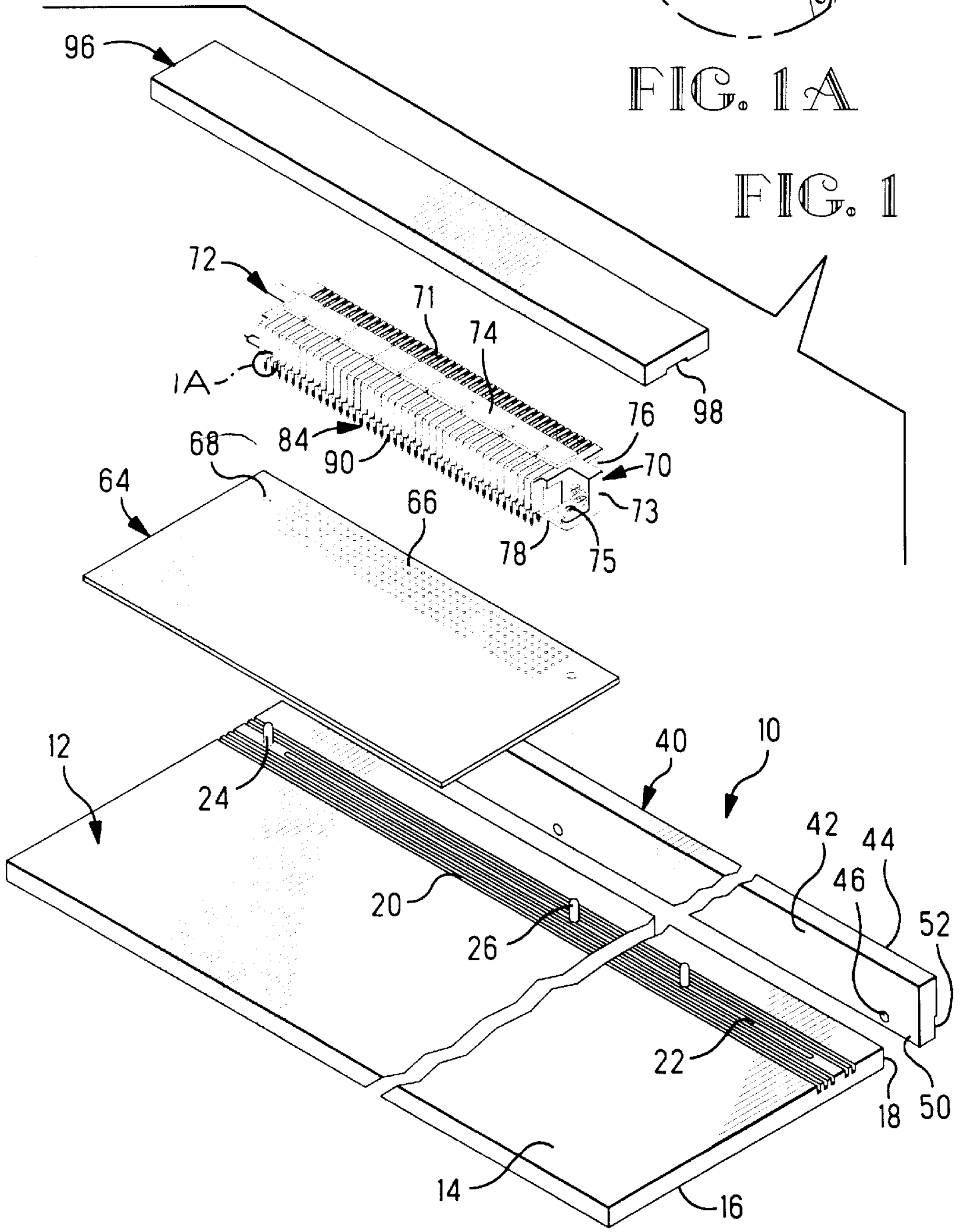
FIG. 1 is a perspective view of the connector being mounted to a circuit board with a tool of the present invention and with the parts exploded from one another.
Figure 2:
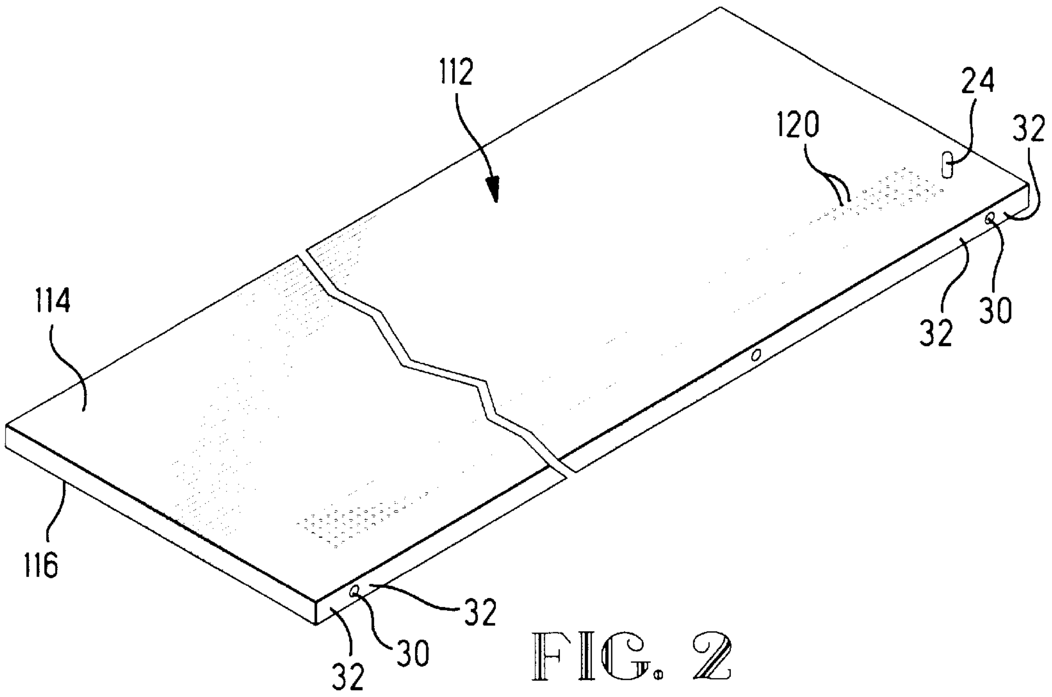
FIG. 2 is a perspective view of the alignment surfaces of the base plate.

Referring now to FIG. 1 through 5, tool 10 includes a base 12, an alignment plate 40 and at least two fasteners 60 for securing alignment plate 40 to base 12. Base plate 12 includes opposed major surfaces 14, 16 and a forward edge 18. Plate 12 further includes a plurality of relief or post-receiving openings 20 extending at least partially through the first major surface 14 toward the second surface 16. FIG. 2 shows an alternative embodiment 112 of the base having opposed surface 114, 116 and a plurality of discrete holes 120 are used for the relief areas for the board mounting terminals of the connector. As shown in FIGS. 1 and 2, relief openings 20, 120 may be rows of discrete holes as shown in FIG. 2 or may comprise parallel slots extending along the major surface as best seen in FIG. 1. Forward edges of boards 12, 112 included a plurality of fastener holes 30 extending partially there into for receiving corresponding fasteners 60. Abutment surfaces 32 surround at least portions of each of the holes 30. In the embodiment shown in FIG. 1, the abutment surface for the alignment plate 40 extends along the entire edge 18.

Figure 12:
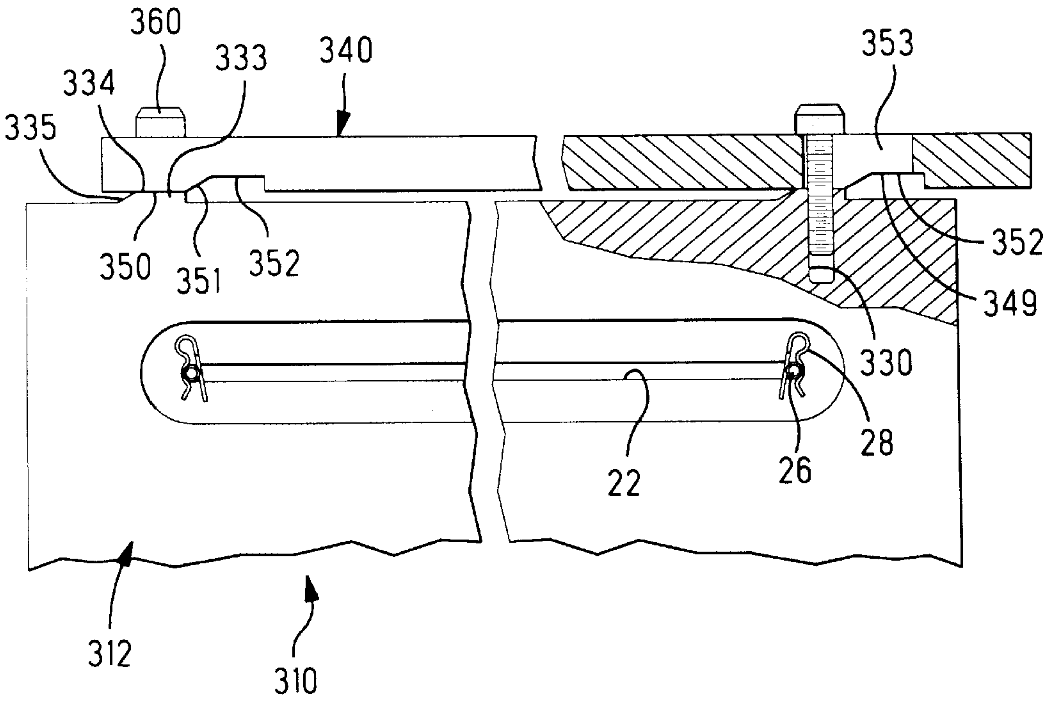
FIG. 12 shows a further alternative embodiment for adjusting the position of the alignment plate to the base plate.
Figure 3:
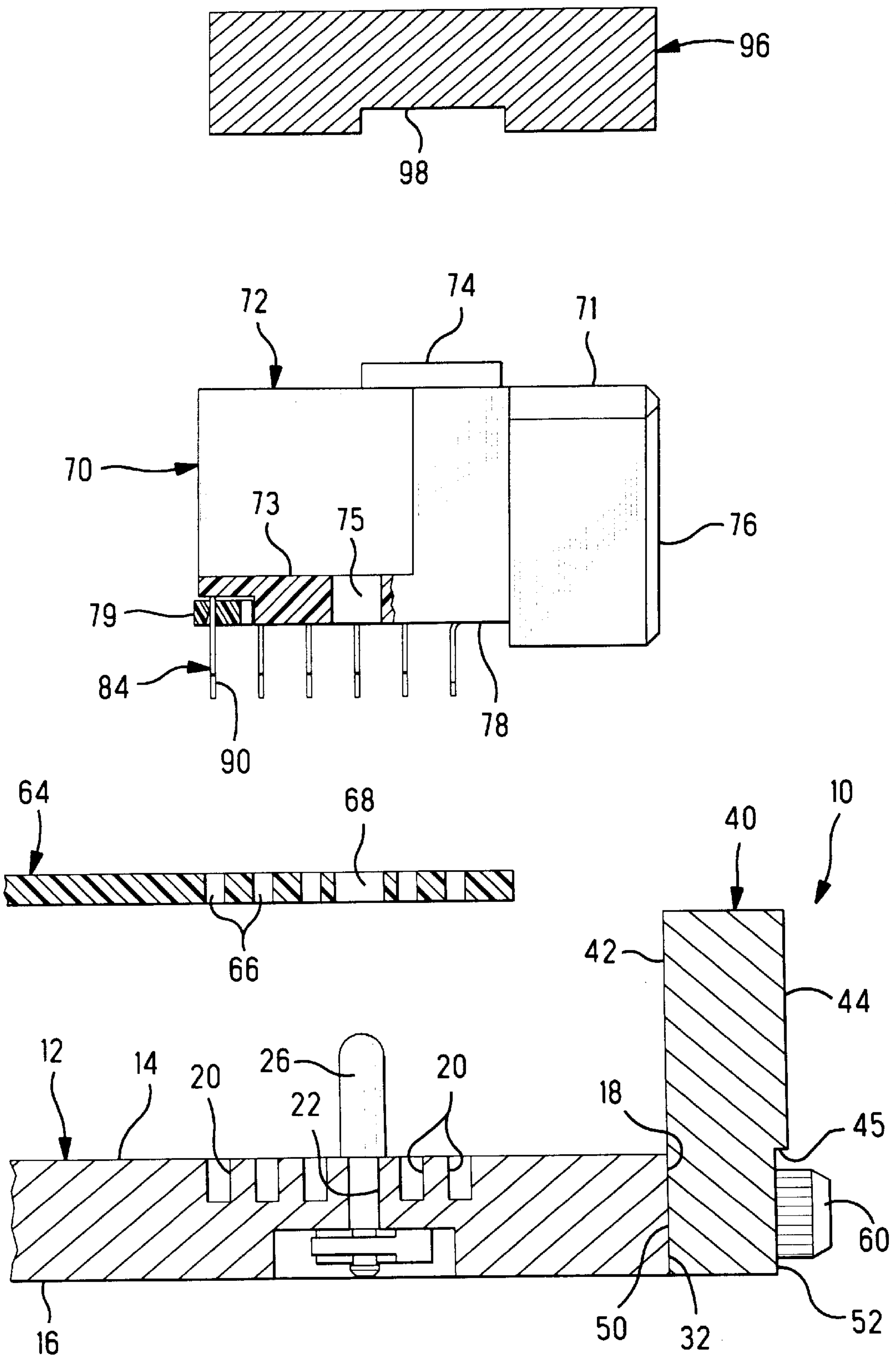
FIG. 3 is a sectional view of the assembled tool with the circuit board of FIG. 1 with the circuit connector and a top plate exploded therefrom.

FIG. 1 also shows alignment pins 24, 26 disposed in the array of relief slots 20 and positioned to align the circuit board and connector in the proper orientation prior to mounting the connector to the board. As shown in FIG. 1 alignment pin 24 is permanently secured in base plate 12 with alignment pins 26, as shown in FIGS. 1 and 3 through 5, positioned in a slot 22 that extends completely through the base plate 12. Alignment pins 26 are adapted to be positioned at a desired location in accordance with the size of the circuit board and connectors being mounted thereto as more fully explained below. As shown in FIGS. 3, 8, and 12 alignment pin 26 is secured in slot 22 by means of a pin 28 which is inserted into a hole of the base of the post secured in position. Alternatively post 126 (FIGS. 6 and 7) may be provided with threaded ends and a nut 128 may be moved to secure the pin to the base plate 12.

Figure 4:
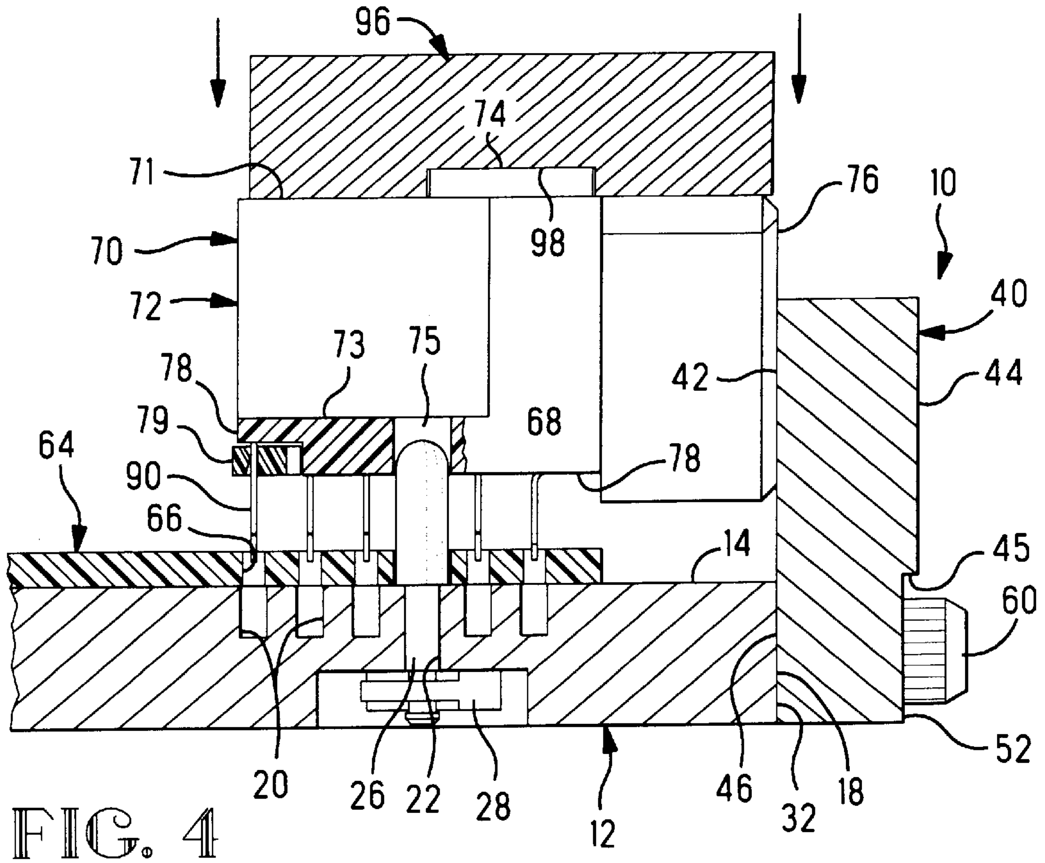
FIG. 4 is a sectional view that shows the connector in position and aligned and ready to mounted to the circuit board.
Figure 5:
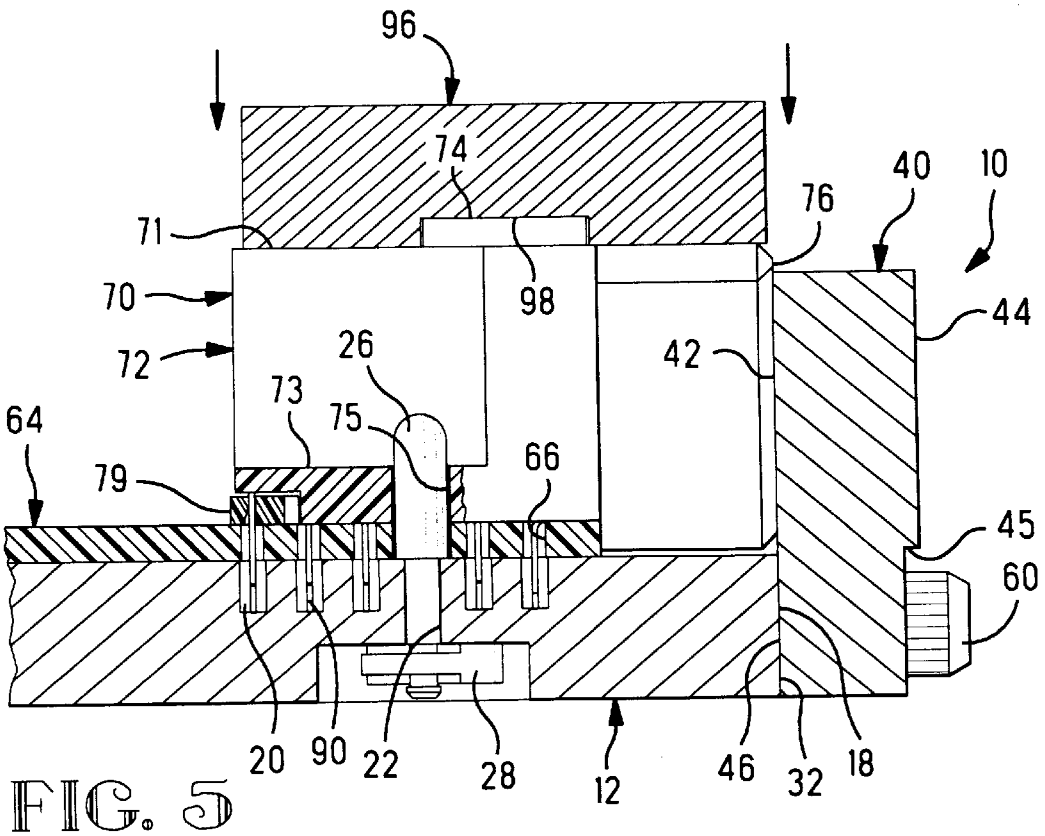
FIG. 5 is a sectional view that shows the connector of FIG. 4 mounted to the circuit board and ready to be removed from the tool.

Alignment plate 40 includes at least two connector alignment surfaces 42, 44 having sets of fastening locations 46 (and 48, FIG. 7) and sets of abutment surfaces 50, 52. FIG. 3 through 5 show the tool 10 with the edge 18 and abutment surfaces 32 thereon in engagement with abutment surfaces 50 of alignment plate 40 such that the connector aligning surface 42 faces toward the row of openings 20. As can be seen in these Figures the alignment plate 40 extends orthogonally above major surface 14 of base plate 12. FIG. 1 also shows a circuit board 64 having a plurality of through holes 66 extending therethrough and alignment holes 68 dimensioned to receive the alignment pins 24, 26 of base plate 12.

Alignment plate 40 is shown with a recess on one side 44 and a flat surface 42 on the other. It is to be understood that additional depths of recesses may be provided at the upper edge of plate 40 such that there are four different positions for securing plate 42 the front surface of respective base plate 12.

Connector 70 includes a housing 72 having a mating face 76 and a board mounting face 78. The housing includes outwardly extending flanges 73 having alignment apertures 75 extending there through. Connector 70 includes a plurality of right angled terminals 84, each having a board engaging post 90 extending from or below the mounting face 78. In the connector embodiment shown, terminal posts 90 have compliant sections (FIG. 1A) that engage the holes of the circuit board in an interference fit. It is to be understood that the invention is not limited to connectors having compliant sections. Connector 70 has a top surface 71 that has a raised center portion 74. Six row connector 70 further includes a terminal position plate 79 that helps to hold the rear row of terminals in alignment. A solid metal top plate 96 having a configured recess 98 dimensioned to surround the raised top portion 74 as best seen in FIGS. 4 and 5, is used to provide a flat surface for applying pressure in the direction of the arrows to mount the connector 70 to the board.

FIG. 3 shows the tool 10 assembled in a first arrangement with the circuit board 64 exploded therefrom and having alignment aperture 68 aligned with post 26 and through holes 66 aligned with slots 20. A connector 70 is exploded from the tool and board with the corresponding board engaging posts 90 aligned with the respective through-holes 66 of board 64. Top plate 96 is further aligned to engage the top surface 71 including the raised top portion 74 of connector housing 72.

FIGS. 4 and 5 illustrate the mounting of connector 70 to the board 64 wherein FIG. 4 shows the circuit board 64 in position on base plate 12 with the through hole 66 aligned with the relief slots 20, alignment pin 26 extending into aperture 75 of flange 73 and top plate 96 positioned on the top surface of the connector. As can be seen in FIGS. 4 and 5 the front face 76 of connector 72 is against the alignment surface 42 thus preventing the connector 70 from tipping as force is applied to plate 96 to position the connector 70 onto the board 64, as shown in FIG. 5.

Figure 6:
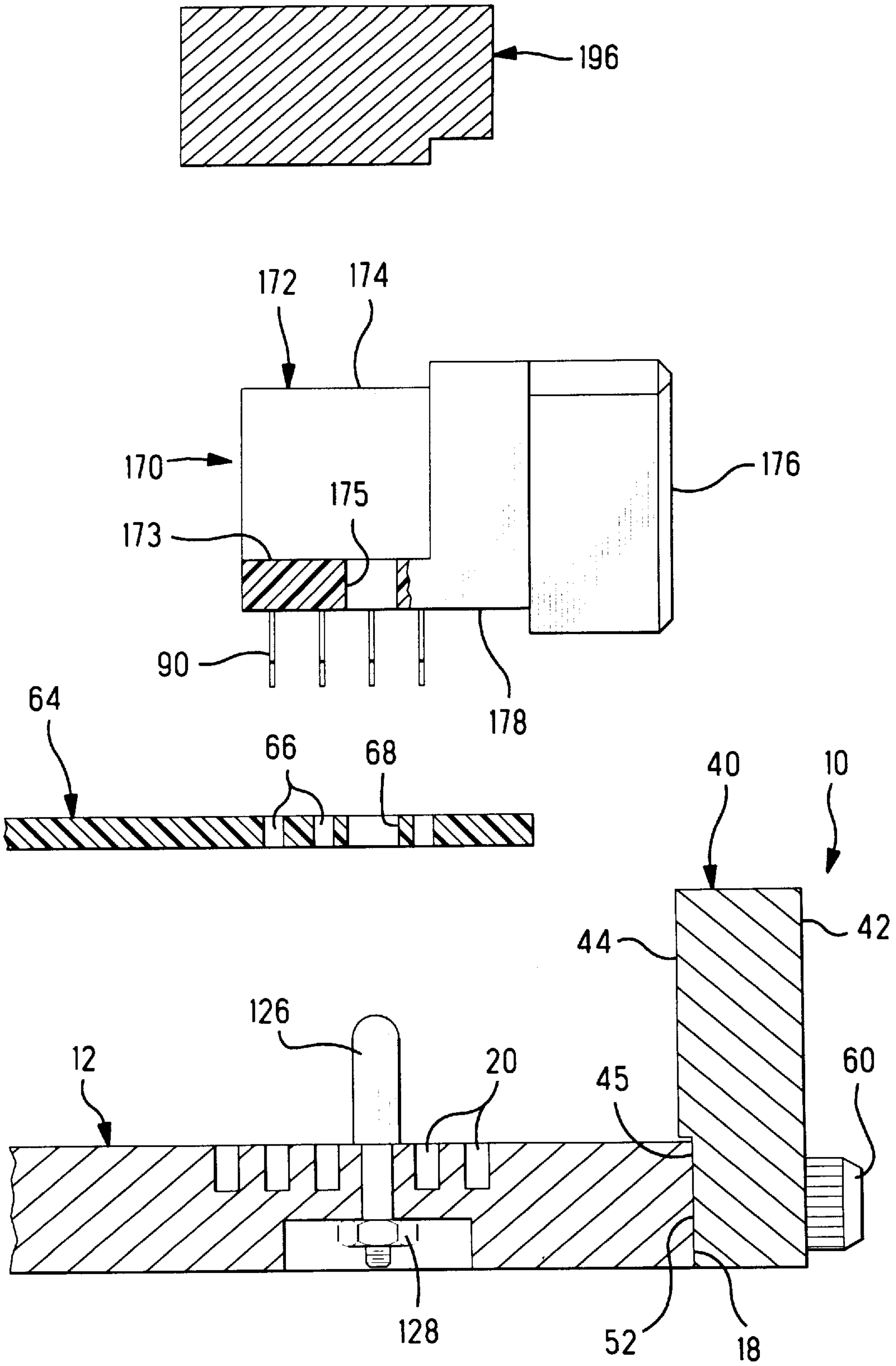
FIG. 6 is a sectional view of a second assembled arrangement of the tool for mounting a different connector to the circuit board with the parts exploded from the assembled tool.
Figure 7:
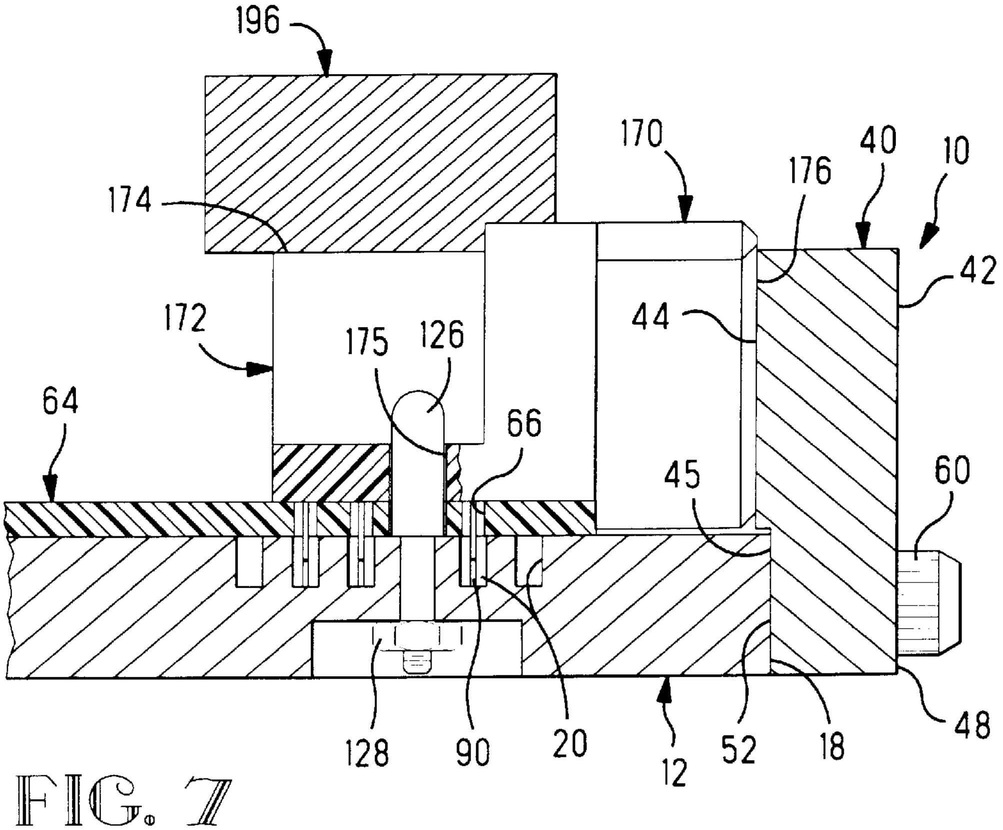
FIG. 7 is a sectional view that shows the connector of FIG. 6 in the tool and mounted to the circuit board.
Figure 8:
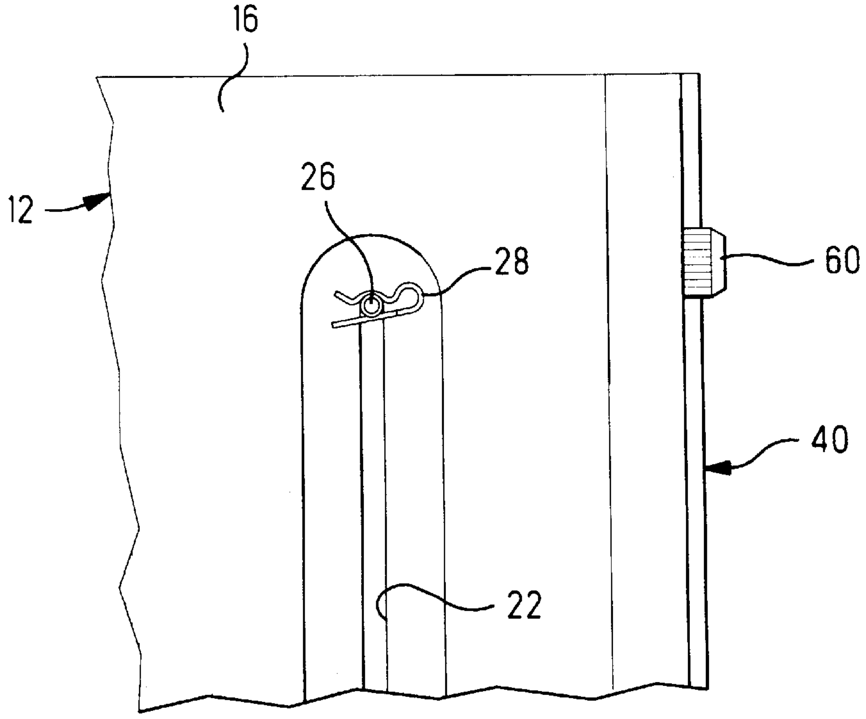
FIG. 8 is a fragmentary plan view showing a portion of the bottom of the base plate, illustrating the securing of the alignment pin.

FIGS. 6 and 7 illustrate a second orientation for alignment plate 40 assembled to the tool 10 in a second assembled arrangement, in which connector alignment surface 44 faces the row of relief slots 20 and abutment surface 52 lies adjacent the edge 18 of the base plate 12. FIG. 6 and 7 further illustrate the use of a threaded alignment pin 126 which is received in the corresponding circuit board aperture 68 and a connector embodiment 170 that has a dimension between the front face 176 and the first row of terminals 84 that is less than embodiment shown in FIGS. 1 through 4, Connector 170 is substantially identical to connector 70 except that there are only four rows of terminals 84 rather than 6 as are present in connector 70. The connector alignment surface 44 lies over a portion of base surface 12 because of the recessed area 45 of the abutment surface 52. Alignment surface 44 prevents the connector 170 from tipping as pressure is applied to the board engaging sections 90 of connector 170. As can be seen from FIG. 6 connector 170 has four rows of terminals and connector 70 has six rows. The mounting plate 196 is used for applying pressure directly above the terminals 84 of connector 170.

Figure 9:
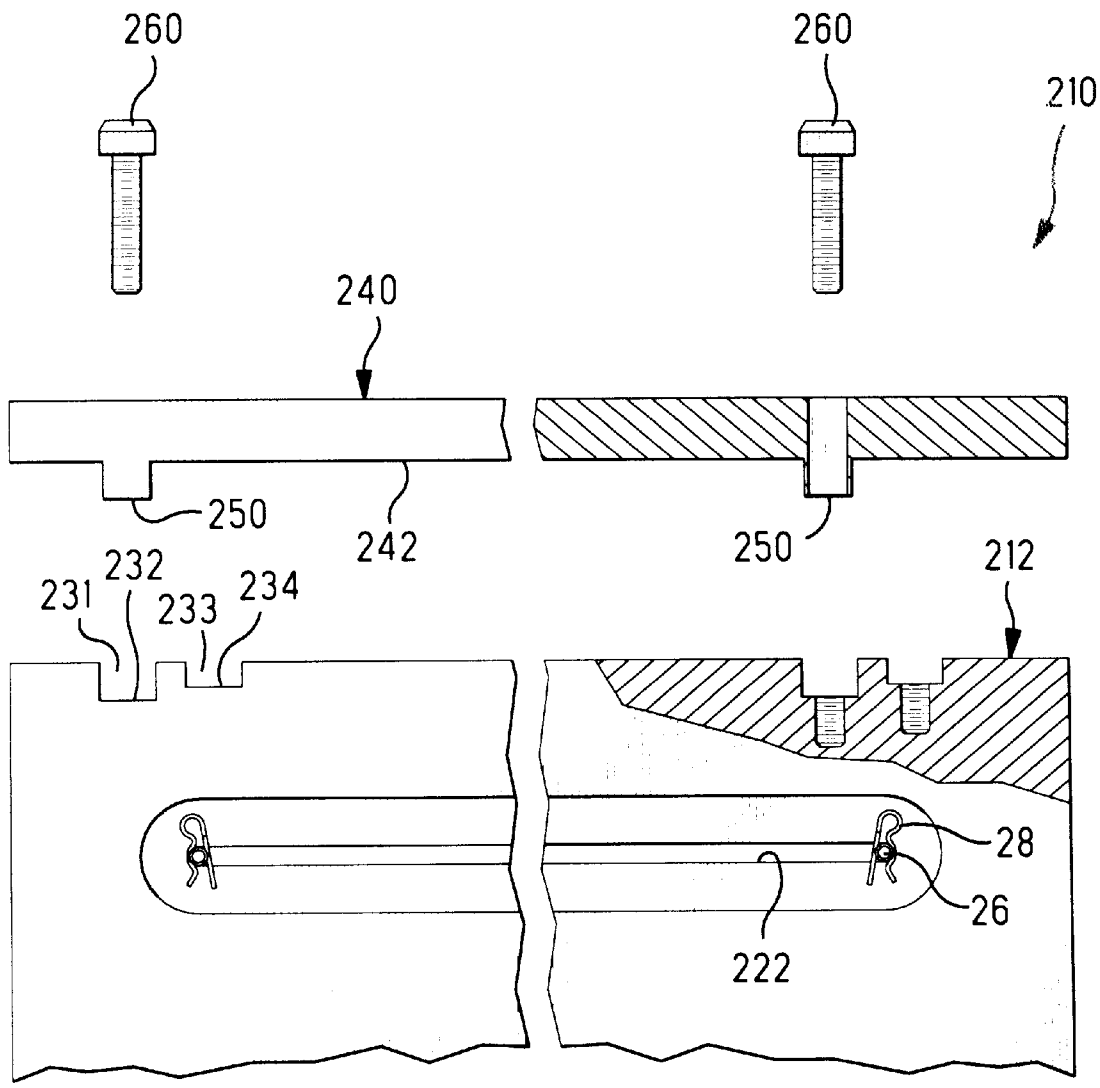
FIG. 9 is a plan view of an alternative embodiment of the tool.
Figure 10:
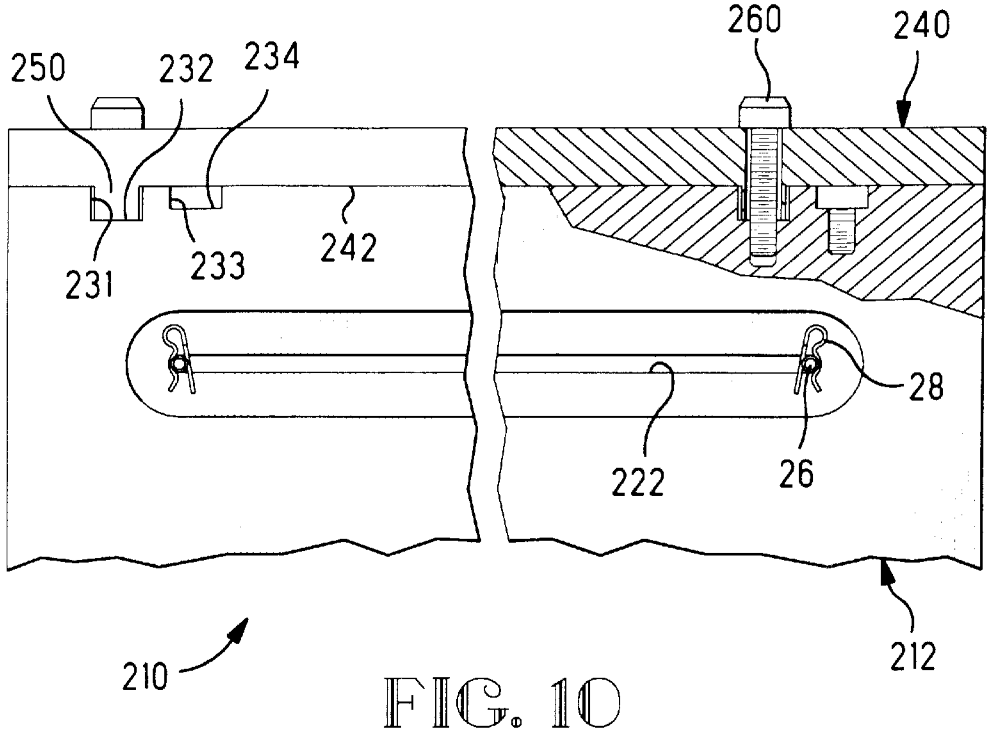
FIG. 10 shows the tool of FIG. 9 in a first assembled arrangement.
Figure 11:
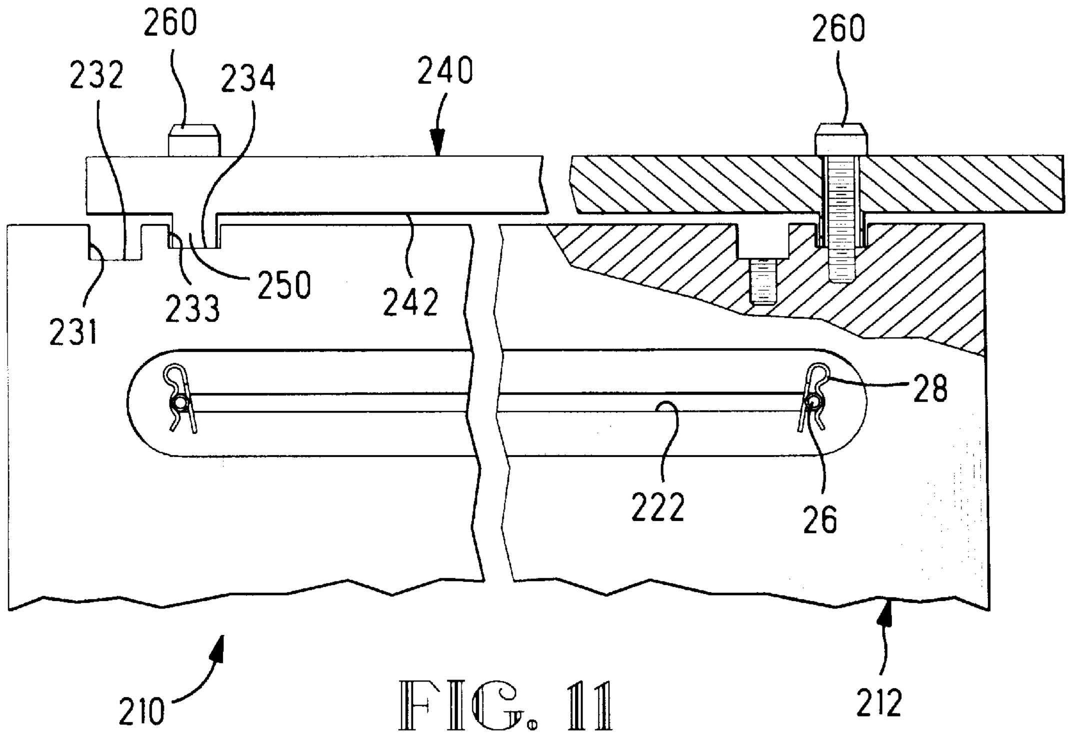
FIG. 11 shows the tool of FIG. 9 in the second assembled arrangement.

FIGS. 9 through 11 show a further embodiment 210 of the tool in which the base plate 212 includes two sets of fastening locations 231 and 233 having abutment surfaces 232, 234 respectively and an alignment plate 240 having two corresponding protrusions 250, defining abutment surfaces. Base plate 212 includes slot 222 for receiving alignment pins 26 secured with respective pins 28 as previously described. Alignment plate 240 and base plate 212 are secured together by fasteners 260. For purposes of illustration FIGS. 9 through 11 are shown as viewed from the bottom of the board 212 and plate 240. As shown in FIGS. 10 and 11 protrusions 250 may be inserted into apertures

231, at a first location (FIG. 10) which results in one spacing of the connector alignment surface 242 with respect to the relief slots (not shown) in the base 212, or into apertures 233 at a second location (FIG. 11), which results in a second spacing between the connector alignment surface 242 and relief slots.

FIG. 12 shows a further embodiment 310 of the tool having at least two positions wherein the base plate 312 includes a set of protrusions 333 having apertures 330 extending therein. The tapered surfaces 335 define camming surfaces extending in a common direction from protrusions 333 and the leading protrusion ends 334 define abutment surfaces. Alignment plate 340 includes a set of recesses 349 dimensioned to receive corresponding ones of the protrusions 333. Each recess has at least one tapered camming surface 351 associated with base plate camming surfaces 335. Alignment plate 340 has a first abutment surface 352 at the base of each recess 349 and a second abutment surface 350 adjacent each tapered camming surface 351, and a set of fastener receiving slots 353. Each slot 353 intersects both the first and second abutment surfaces and the camming surface therebetween. Alignment plate 340 can be translated from a first position in which the base protrusion ends 334 abut the first abutment surfaces 352 to a second position in which the base protrusion ends 334 abut the second abutment surfaces 350. The fasteners 360 are positioned within slots 353 such that fasteners 360 can be loosened to allow the plate 340 to be moved between the two positions. Alignment plate 340 remains loosely secured to the base plate 312 while being moved between the two positions.

The alignment fixture of the present invention provides a readily adjustable tool that may be used to position connectors prior to being mounted to a circuit board. The tool assures that while pressure is being applied to the top of the connector, the front face of the connector is held precisely perpendicular to the circuit board so that the connector does not tip while insertion is taking place. While shown with a right angle connector, it is to be understood that the positioning fixture may also be used with vertically mounted connectors as well, particularly when there is a portion of the housing extending outwardly and horizontally away from the rows of terminals.

It is thought that the seating tool of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. A seating tool for installing connectors on a circuit board, each said connector having a plurality of terminals disposed in at least one row therein parallel to a connector front face, said terminals having board engaging posts for electrical connection to circuits of the board, the connector front face disposed at a preselected distance from a nearest row of terminals; said tool comprising:

a base plate for supporting the circuit board and having post-receiving openings thereinto; and an alignment plate removably fastenable to an edge of said base plate, said alignment plate having at least one connector alignment surface thereon, and having at least two sets of plate-edge-abutting surfaces, each set of plate-edge-abutting surfaces being associated with a said connector alignment surface to particularly orient said respective connector alignment surface facing toward said post-receiving openings of said base plate and spaced a selected distance therefrom when the set of plate-edge-abutting surfaces abuts said base plate edge upon mounting said alignment plate thereto, whereby when the connector front face abuts the connector alignment surface facing the post-receiving openings, the connector is thereby positioned appropriately with respect to said post-receiving openings of said base plate, for mounting of the connector to the board when the board is disposed on said base plate with through-holes thereof aligned with said post-receiving openings of the base plate.

2. The seating tool of claim 1 wherein said alignment plate includes two alignment surfaces on respective opposed faces of said alignment plate.

3. The seating tool of claim 1 wherein said base plate includes at least first and second sets of recesses, said first set of recesses having a depth different from that of said second set of recesses, and said alignment plate having a single set of fastening locations, each said fastening location having a protrusion extending outwardly therefrom, and faces of said protrusions defining said plate-abutting surfaces, whereby said protrusions are received in a selected one of said at least said first and second sets of recesses for said faces to abut bottoms of said recesses.

4. The seating tool of claim 1 wherein said at least two connector alignment surfaces are disposed on a common side of said alignment plate;

said base plate includes a set of protrusions, each said protrusion having at least one corresponding tapered side defining a camming surface and an abutment surface at a leading end thereof, with the camming surfaces extending in a common direction from a respective said protrusions; and said alignment plate includes a set of recesses, each said set of recesses being associated with a respective said connector alignment surface, each said recess being dimensioned to received a corresponding one of said base plate protrusions and having at least one tapered camming surface associated with said camming surface of a corresponding one of said base plate protrusions, said alignment plate having a first abutment surface at a base of each said recess and a second abutment surface adjacent each said tapered camming surface, and a set of fastener-receiving slots, each said slot intersecting said first and second abutment surfaces and said camming surface of one of said recesses, whereby said alignment plate can be secured loosely to said base plate in one of said first and second positions and translated to a remaining one of said first and second positions, with said fasteners remaining extended through said slots and engaged in corresponding fastener locations of said base plate.

* * * * *